(12) United States Patent
Zhodzishsky et al.

(10) Patent No.: US 10,031,236 B2
(45) Date of Patent: Jul. 24, 2018

(54) NAVIGATION RECEIVER WITH AN ADAPTIVE SYSTEM FOR TRACKING CARRIER PHASES RECEIVED FROM A CONSTELLATION OF NAVIGATION SATELLITES

(71) Applicant: Topcon Positioning Systems, Inc., Livermore, CA (US)

(72) Inventors: Mark Isaakovich Zhodzishsky, Moscow (RU); Vladimir Viktorovich Beloglazov, Moscow (RU); Dmitry Markovich Zhodzishsky, Moscow (RU); Viktor Abramovich Veitsel, Moscow (RU)

(73) Assignee: Topcon Positioning Systems, Inc., Livermore, CA (US)

( * ) Notice: Subject to any disclaimer, the term of this patent is extended or adjusted under 35 U.S.C. 154(b) by 288 days.

(21) Appl. No.: 15/027,490

(22) PCT Filed: Oct. 6, 2015

(86) PCT No.: PCT/RU2015/000646
§ 371 (c)(1),
(2) Date: Apr. 6, 2016

(87) PCT Pub. No.: WO2017/061889
PCT Pub. Date: Apr. 13, 2017

(65) Prior Publication Data
US 2017/0261618 A1    Sep. 14, 2017

(51) Int. Cl.
*G01S 19/29* (2010.01)
*H03L 7/08* (2006.01)
(Continued)

(52) U.S. Cl.
CPC .......... *G01S 19/29* (2013.01); *G01S 19/235* (2013.01); *G01S 19/24* (2013.01); *G01S 19/37* (2013.01); *H03L 7/08* (2013.01)

(58) Field of Classification Search
CPC ........ H03L 7/183; H03L 7/08; H03L 7/1976; G01S 19/37; G01S 19/24; G01S 19/30;
(Continued)

(56) References Cited

U.S. PATENT DOCUMENTS

| 6,081,228 A * | 6/2000 | Leimer | .................. G01S 19/21 342/357.48 |
| 6,313,789 B1 * | 11/2001 | Zhodzishsky | ........... G01S 19/29 342/357.68 |

(Continued)

FOREIGN PATENT DOCUMENTS

WO    WO1998043372    10/1998

OTHER PUBLICATIONS

Search Report in PCT/RU/2015/000646, dated Jul. 18, 2016.

*Primary Examiner* — Olumide T Ajibade Akonai
(74) *Attorney, Agent, or Firm* — Bardmesser Law Group

(57) ABSTRACT

A system for estimating carrier phases of radio signals in a satellite navigation system receiver for coordinate determination includes a complex of reference signals (CRS), wherein, in each $j^{th}$ satellite channel, a digital reference signal $RefSig_j$, represents an output phase and frequency-controlled oscillation of a corresponding numerically-controlled oscillator ($NCO_j$) for each $j^{th}$ satellite channel, the phase of the oscillation of the $NCO_j$ tracking a carrier signal received from the $j^{th}$ satellite; and an adaptation complex (AC) that, in response to vibration or movement of the receiver, changes (expands or reduces) an effective bandpass of the CRS, producing control signals that determine phase and frequency changes in the corresponding $NCO_j$ for reducing dynamic distortions in coordinate measurements.

25 Claims, 4 Drawing Sheets

(51) Int. Cl.
*G01S 19/24* (2010.01)
*G01S 19/23* (2010.01)
*G01S 19/37* (2010.01)

(58) Field of Classification Search
CPC ...... G01S 19/235; G01S 19/29; G01S 19/254;
G01S 19/31; G01S 19/04; G01S 19/09;
G01S 19/54; G01S 19/33; H04B 1/7085;
H04B 7/01
See application file for complete search history.

(56) References Cited

U.S. PATENT DOCUMENTS

| | | | |
|---|---|---|---|
| 6,493,378 B1 * | 12/2002 | Zhodzishsky | G01S 19/22 375/149 |
| 7,102,563 B2 * | 9/2006 | Rapoport | G01S 19/44 342/357.27 |
| 7,388,539 B2 * | 6/2008 | Whitehead | G01S 19/44 342/357.36 |
| 8,777,388 B2 † | 7/2014 | Borra | |
| 2010/0039182 A1 * | 2/2010 | Galton | H03K 23/54 331/1 A |
| 2011/0012783 A1 * | 1/2011 | Zhodzishsky | G01S 19/30 342/357.26 |
| 2011/0050998 A1 * | 3/2011 | Gao | H03L 7/0805 348/536 |
| 2011/0193741 A1 * | 8/2011 | Kumar | G01S 19/26 342/357.25 |
| 2011/0260916 A1 | 10/2011 | Zhodzishsky et al. | |
| 2012/0041702 A1 * | 2/2012 | Toda | G01C 21/16 702/94 |

\* cited by examiner
† cited by third party

NAVIGATION RECEIVER WITH AN ADAPTIVE SYSTEM FOR TRACKING CARRIER PHASES RECEIVED FROM A CONSTELLATION OF NAVIGATION SATELLITES

BACKGROUND OF THE INVENTION

Field of the Invention

The present invention relates generally to global navigation satellite systems, and more particularly, to a method and devices for reducing an impact of shock and vibration on global navigation satellite system measurements.

Description of the Related Art

Global navigation satellite systems (GNSSs) can determine receiver location with high accuracy. Currently deployed global navigation satellite systems are the United States' Global Positioning System (GPS), the Russian GLONASS, the European GALILEO system, etc.

In a GNSS, a navigation receiver receives and processes radio signals transmitted by satellites located within a line-of-sight of the receiver. The satellite signals comprise carrier signals modulated by pseudo-random (PR) binary codes. These codes can additionally be modulated by binary information symbols.

The receiver measures the time delays of the received signals. For each satellite, the delay is measured relative to some scale. There is a rough scale to measure PR-code delay and, in addition, the delay in carrier phase can be measured. Such measurements have a small ambiguity interval (carrier period/cycle), but provide a higher accuracy. Carrier phase measurements are very important in differential navigation.

The following tracking systems are used: Delay Lock Loop (DLL) to track code delays and Phase Lock Loop (PLL) to track carrier phase delays. A few individual loops track each satellite.

An individual tracking channel is a structural unit of the receiver that measures a code delay and a carrier phase delay on a particular frequency from a satellite.

Processing the received satellite signal in each channel comprises accumulation of multiplication results of the signal (passed through the input and filtering circuits and frequency converter) by a reference carrier phase and/or reference code being generated in the receiver. The reference carrier corresponds to the carrier of the received signal for the given satellite, and the reference code corresponds to the PR-code of the same satellite. Circuits for multiplying and accumulating are called "correlators", and the corresponding process is called correlation of two signals.

Many approaches to building receiver channels are known. The most specific is the structure of the individual channel with three paths and coherent generation of the reference carrier.

The first path calculates an in-phase correlation signal I. Such a signal is obtained if the first reference carrier is used, which is in-phase with the carrier of the input signal, and the reference code is a replica of the PR-code modulating the input signal.

If there is a phase correction of the reference carrier $\varphi$ and a time shift of the reference code $\varepsilon$, the signal I is $$I = \mu U_m R_0(\varepsilon) \cos \varphi,$$

Where $\mu$ is the binary symbol, $U_m$ is the amplitude of the received signal, and $R_0(\varepsilon)$ is the cross-correlation function of the PR-code, passed through the receiver filter and the reference code, which is a locally-generated replica of the input PR-code.

The second path calculates a quadrature correlation signal Q. This signal is based on the second reference carrier which is $\pi/2$-shifted from the first reference carrier. Their correlation results in the quadrature component of the input signal. The reference code is the same as in the first path. Signal Q is presented as:

$$Q = \mu U_m R_0(\varepsilon) \sin \varphi$$

Correlation signals Q, I are used for building a PLL phase discriminator that outputs a mismatch signal Z for the closed loop of the tracking system. The most commonly used form of this dependence is $Z = \text{Arctg}(Q/I)$.

A discriminator characteristic in the navigation receiver in the form of a mismatch signal-carrier phase dependence always includes a non-linearity. The dependence can be considered linear only at small mismatches in tracking mode. Bandwidths of the tracking loops should be chosen such that small dynamic errors at varying delays shall be provided.

The wider the bandpass, the smaller the dynamic errors. However, it is unacceptable to excessively expand the bandpass, since errors grow due to additive interference (including inherent receiver noise), and clock cycle slips and jumps become possible.

There are methods of resolving this problem by applying the total energy of all observed satellite to track common disturbances in a wider band (U.S. Pat. No. 6,313,789). The main idea there is generation of both individual PLLs tracking carrier phases of each of N satellites in view and of common loop tracking disturbances of carrier phases caused by the same causes for all the satellites.

Combining the common loop and N individual PLL circuits results in a multi-loop control system with new useful performance. Some external influences affecting the carrier phase are common for all channels. They are movements of receiving equipment and fluctuations of the reference generator frequency. These effects are mainly tracked by the common loop. Other external influences are individual and in practice independent in different channels. They are noise, most of atmosphere errors, frequency fluctuations of the onboard reference generator, and errors of anticipated satellite trajectory. They can be tracked by individual PLLs.

Since external common influences have a wider spectrum than that of individual ones, the common loop has to be made wider than individual PLLs. But common action of many satellites gives additional possibilities.

Implementation of the stable joint functioning of individual and common loops is contradictory and complicated enough. When high vibration and shocks with a wide spectrum are present, the common loop needs to be rapidly responsive and hence needs to have a high clock rate. The high clock rate can be unacceptable for the individual loop due to insufficient energy potential/power budget.

A common use of individual loops and common PLL loops has some danger of causing mutual influence of the individual loops. As a result, an inter-channel interference can occur, and loss of tracking in one PLL can cause tracking losses or jumps in PLLs of different channels.

Further improvement of the tracking system was proposed in commonly owned U.S. patent application Ser. No. 14/357,421, filed on May 9, 2014, incorporated herein by reference, describing a method of building a tracking system where a numerically-controlled oscillator (NCO) and a loop filter are common members of the individual and common tracking loops. It eliminated inter-channel interference and provided a stable tracking in a wide range of external dynamic disturbances.

U.S. Pat. No. 7,495,607 describes a method of building the navigation receiver with changeable status of satellite channels. Receiver adaptation to external conditions is achieved by switching guided and guiding PLLs tracking carrier phases of satellite channels, depending on the quality of the received input signal. When the number of simultaneously observed satellites is more than is needed, the adaptation provides independent operation of channels for those satellites whose signals at the current time are stronger and can be tracked by a wideband PLL. On the other hand, the adaptation allows tracking weak satellite signals thanks to narrow-band PLL, the operation of which is facilitated by compensating for interference due to strong signals.

Accordingly, a method and system for a more robust tracking of navigation signal's carrier phase is desired.

SUMMARY OF THE INVENTION

The present invention is related to a navigation receiver with an adaptive system tracking carrier phases received from navigation satellites that substantially obviates one or several of the disadvantages of the related art.

In one embodiment, a system for estimating carrier phases of radio signals in a satellite navigation system receiver for coordinate determination includes a complex of reference signals (CRS), wherein, in each $j^{th}$ satellite channel, a digital reference signal $RefSig_j$, represents an output phase and frequency-controlled oscillation of a corresponding numerically-controlled oscillator ($NCO_j$) for each $j^{th}$ satellite channel, the phase of the oscillation of the $NCO_j$ tracking a carrier signal received from the $j^{th}$ satellite; and an adaptation complex (AC) that, in response to vibration or movement of the receiver, expands an effective bandpass of the CRS, producing control signals that determine phase and frequency changes in the corresponding $NCO_j$ for reducing dynamic distortions in coordinate measurements Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED FIGURES

The accompanying drawings, which are included to provide a further understanding of the invention and are incorporated in and constitute a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

This invention proposes a method of processing measurements in a navigation receiver on a basis of estimating carrier phases of satellites in view. Phases measured at the output of numerically-controlled oscillators (NCO), being a part of phase tracking systems, are used to determine coordinates of a moveable navigation receiver.

In the process of movement, the receiver is subject to strong dynamic effects that cause unpredictable fast changes in NCO phase and frequency and hence large errors in the measured coordinates.

Since effects from dynamic disturbances strongly depend on structure and parameters of the phase tracking system, the proposed system uses an adaptation system complementing the tracking system with a means for detection and compensation for signal deterioration, thereby preventing errors in coordinate determination.

Adaptation capabilities in processing input signals are based on analyzing processes in phase tracking loops, where additional mismatch signals caused by intense dynamic disturbances are generated in discriminator units.

The proposed processing method uses a phase tracking structure comprising two types of tracking loops. One of them tracks mismatch signals caused by disturbances in the channels of specific satellites. These circuits are individual loop PLLs.

The other type of circuits tracks changes in mismatch signals caused by disturbances in measured coordinate changes and characteristics of moving receiver's master/reference generator. These circuits are referred to as common loop PLLs. Even though individual and common loops operate based on the same satellite signals, and some structural elements are common, their mismatch signals are different and respond differently to dynamic effects. Dangerous dynamic disturbances are most reflected/visible in the common loops. The mismatch signals of the common loops therefore reveal outliers/jumps, and control/guiding signals are generated there that correct the performance of the tracking system.

Figure 1:
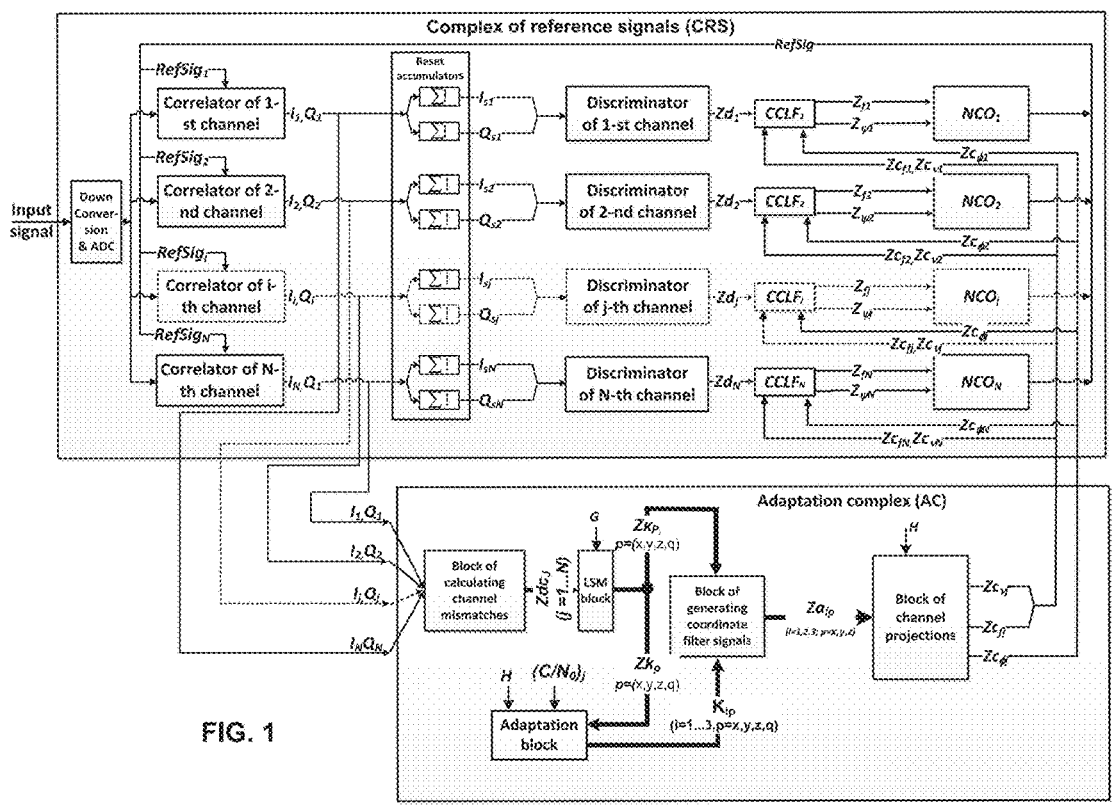
FIG. 1 illustrates an adaptive tracking system of the present invention.

A general functional schematic of the adaptive phase tracking system is shown in FIG. 1. The schematic includes two coupled complexes—the complex of reference signals (CRS) and the adaptation complex (AC).

The CRS receives signals from many navigation satellites at its input after they passed amplification, frequency conversion, filtering and sampling/digitization. Blocks of channel correlators generate correlation signals—an in-phase correlation signal $I_j$ and a quadrature signal $Q_j$, where j is the number of the satellite channel, $1 \leq j \leq N$.

In the CRS, satellite carrier phase is tracked by an $NCO_j$ of the $j^{th}$ satellite channel. These carrier phases are used as a parameter to determine moving receiver coordinates.

Figure 4:
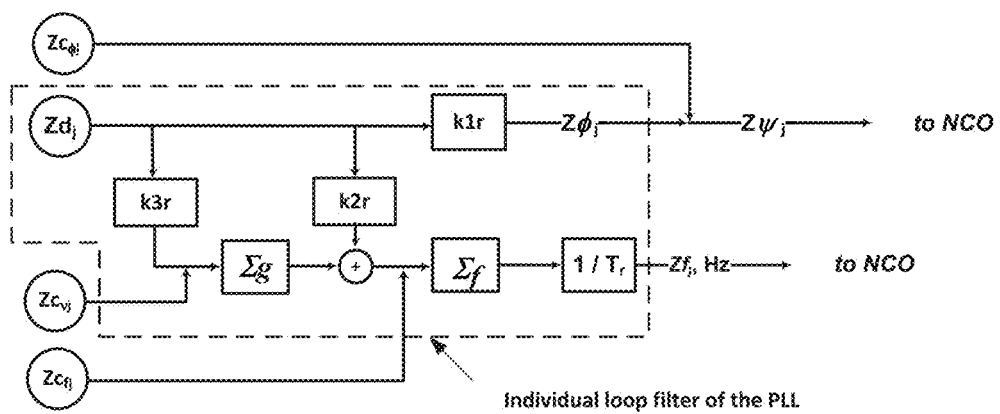
FIG. 4 illustrates an integrated controlled loop filter of the $j^{th}$ channel.

The AC shown in FIG. 1 receives the correlation signals $I_j$, $Q_j$ at its input from the CRS and, after transformation, generates at the output of each satellite channel three different common loop control signals $Zc_{pj}$ (where p=v, f, $\varphi$). Here, the index p refers to which integrator of the common controlled loop filter (CCLF) the signal should be added. The index p=$\varphi$ means that the signal through CCLF is added to the phase $NCO_j$. The index p=f means that the signal is added to the integrator $\Sigma_f$, and frequency is later taken from this integrator, and the index p=v means that the signal is added to the integrator $\Sigma_g$. The CCLF diagram of FIG. 4 shows this in more detail. (In the remainder of this text, designations of values in the figures and in the text are given in Latin and Greek letters according to the following rule: the name of the value is in a conventional font, in the subscript index there are variables, indicating a plurality of the single-type devices multiply repeated in the receiver.) Control signals are sent back to the CRS and correct NCO phase to reduce the effects of dynamic disturbances on the tracking quality and, as a consequence, on coordinate errors.

Complex of Reference Signals (CRS)

A plurality of satellite channels are used, each of which mainly corresponds to the known typical PLL circuit and has well-known elements forming a closed circuit. FIG. 1 shows these loop-forming elements: a correlator, a discriminator, a common controlled loop filter (CCLF), NCO. The elements can be implemented in different variants, but they mostly perform well-known functional transformations in PLL-based systems. The following distinctions of these elements are used in the present invention.

A correlator generates correlation signals in two stages. At the first stage, correlation signals $I_j$, $Q_j$ are generated and their accumulation occurs over a short time interval (Tc≈1 ms). Clock rate Fc is roughly 1 kHz. At the second stage, accumulation continues up to approximately Tr=5 ms, and correlation signals of individual loops $I_{sj}$, $Q_{sj}$, are generated with a lower clock rate (Fr≈200 Hz). In FIG. 1, reset accumulators of the second stage (reset at every 5-th ms) are designated by symbols $\Sigma\downarrow$.

A discriminator generates a signal $Zd_j$ of channel mismatch for an individual loop. Many variants of discriminators are known, for the current case, the optimal is $Zd_j=\text{Arctg}(Q_j/I_j)$ or $Zd_j=Q_j/I_j$.

A loop filter used in the present invention (in FIG. 1, it is designated $CCLF_j$) has essential differences from standard loop filters and can be defined as a "common controlled loop filter" (CCLF). The proposed filter is common, since it is a common element for individual and common loops. The filter is also controlled, since it receives control signals ($Zc_p$) from the adaptation complex, the characteristics of these signals varying in response to external dynamic disturbances.

The NCO receives, from the CCLF, two signals for frequency-phase control: a signal $Z_{fj}$, controlling NCO frequency shift and a signal $Z_{\psi j}$ controlling phase shifts. Oscillations generated by the NCO are received at the correlator and are used as a reference signal closing the individual loop.

An individual loop operates at a low enough clock rate and tracks small disturbances typical to individual satellite channels. Its bandwidth $B^{PLL}$ therefore can be made narrow/small (and therefore its inertia is comparatively large).

Adaptation Complex

It can be seen from FIG. 1, that correlation signals $I_j$, $Q_j$ are fed to the input of the adaptation complex at high clock rate Fc. The same signals are repeated in FIG. 2, where some parts of the adaptation complex are shown in more detail. Signals ($Zdc_j$) are calculated at the same high clock rate as in the block of calculating channel mismatches (FIG. 1), in AD discriminators, similar to those of the CRS, these signals being signals of channel mismatch.

If the AC operates at the same rate as individual loops (in particular, at the same rate as AC discriminators), one should not calculate the signals of channel mismatch ($Zdc_j$) in AC, and the signals of channel mismatching for individual loops $Zdj$ can be taken from CRS instead. In this case only signals $Zd_j$ arrive at the input of the AC, rather than signals $I_j$, $Q_j$.

Figure 2:
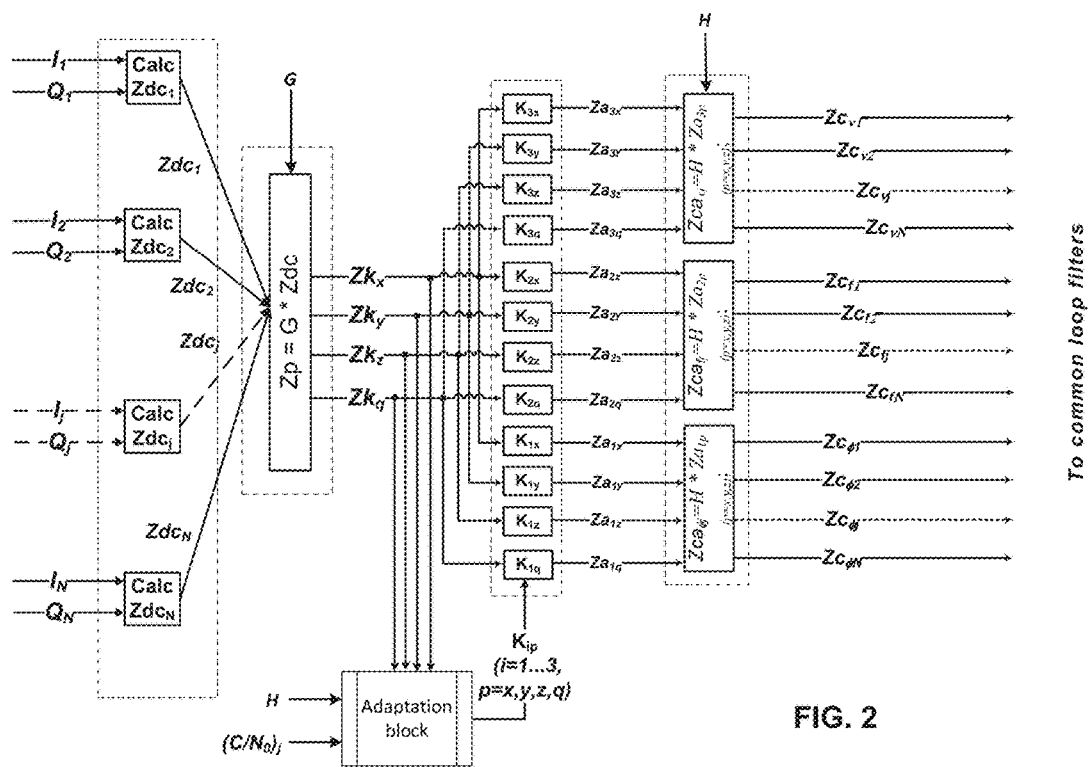
FIG. 2 illustrates the adaptation complex.

A transition to the common loops, operating at a high clock rate, starts from these signals. The transition process is in calculating mismatches of measured coordinates (based on the found mismatches in the discriminators of the individual channels). The transition is similar to the process of determining moving receiver coordinates based on a plurality of observed phases (or time delays). The process can be implemented by the Least Square Method (LSM) (see LSM block in FIG. 1) and mathematically expressed as multiplying a matrix G by a vector Zdc (as shown in FIG. 2). Obtained signals of coordinate mismatches $Zk_p$ (where p=x, y, z, q is the measured coordinates) are analyzed to detect outliers arising when intense dynamic effects affect the receiver. Such an analysis is implemented in the adaptation block shown in FIG. 1 and FIG. 2. In this block, threshold values are calculated. The thresholds are not to be exceeded by the smoothed signal of coordinate mismatches in a standard operation mode. When a dynamic effect is present, the threshold is exceeded, and this triggers a change of control signals for the common loop filter for this coordinate.

The receiver is assumed to measure four coordinates: three geometric receiver coordinates X, Y, Z, and the fourth coordinate Q considers a time offset relate to a local quartz clock generator. The adaptation block (shown in FIG. 2) correspondingly receives 4 signals of coordinate mismatches to its inputs $Zk_x$, $Zk_y$, $Zk_z$, $Zk_q$. Each of the signals is filtered to reduce noise components of errors and then compared with the threshold. Signals controlling loop filters are produced depending on the comparison, the three control signals being outputted for each loop filter. A block of generating signals for coordinate filters (FIG. 1) performs this task together with the adaptation block. Several operations are carried out in these blocks. Upon receiving a comparison-to-threshold result in the form of binary signal (yes-no), the adaptation block subsequently calculates scaling and adaptive coordinate coefficients, which are further used to generate coordinate adaption signals $Za_{ip}$, where (i=1, 2, 3; p=x, y, z, q). Three signals of coordinate adaptation should be outputted for each of the four measured coordinates.

The latter operation of obtaining $Za_{ip}$ is shown in more detail in FIG. 2. Blocks multiplying two values: the coordinate mismatch signal $Zk_p$ (where p=x, y, z, q), and adaptive coordinate coefficient $K_{ip}$ (p=x, y, z, q; i=1, 2, 3) calculated according to FIG. 3: $Za_{ip}=Zk_p$, $K_{ip}$.

Control is separate for each satellite depending on its position in the constellation. Hence, in each channel, for each geometric coordinate, there are calculated their own control signals of the common loops by projecting the vector of coordinate adaptation onto the direction to the satellite. In FIG. 2 this operation is shown as multiplication of matrix H (matrix of directional cosines supplemented by a unit column-vector) by vector $Za_{ip}$. The obtained projection signals, together with a quartz clock component, which is the same for all the satellites, generate control signals of common loops $Zc_{pj}$, (where p=v, f, ϕ), these signals are fed to the inputs of the common controlled loop filter.

The above-mentioned algorithm of generating control signals for common loops suggests an equally-probable distribution of directions for dynamic effects on the receiver in space. If exposure conditions allow separating the most dangerous or, opposite, most favorable dynamic directions, it should be considered in adjusting the adaptation system for this exposure condition. For example, if the receiver operates on a vehicle travelling on asphalt paved roads, the dynamic effects in a local vertical will be considerably smaller than in horizontal coordinates. In this case re-calculation of three coordinate mismatches $Zk_x$, $Zk_y$, $Zk_z$ needs to be done in the ENU coordinate system (the navigation coordinate system (East-North-Up), where axis X is tangential to the geoid in the East direction, axis Y is tangential to the geoid in the North direction, and axis Z is up towards the local normal to the geoid. In addition, in the adaptation block, one needs to re-calculate matrix of directional cosines H in the coordinate system ENU.

The adaptation complex is a part of the closed circuit of the common loop. The circuit can be seen in FIG. 1, if one starts from the input of the adaptation complex (signals $I_j$, $Q_j$). Further, it goes through blocks of the adaptation complex, goes out to blocks of the common controlled loop filter and, via NCO control signals, goes to controlling phase and frequency of the NCO-generated signal. The resultant signal is fed to the correlator as a reference signal ($RefSig_j$) and, taking part in generating $I_j$, $Q_j$ signals, closes the circuit of the common loop.

Adaptive Tracking

A comparison of individual and common loops shows that despite available common elements, circuits of both loops can be substantially different and react differently to dynamic effects. High clock rate enables to make the common loop low-inertial and capable of tracking fast disturbances.

Joint operation of two complexes (CRS and AC) forms an entire adaptive digital multi-circuit tracking system to track carrier phases of satellite signals comprising the following related closed systems:
- a plurality of individual digital PLLs (according to the number of satellites in view) with narrow enough pass bands operating at a low clock rate;
- three common digital PLLs (according to the three geometric coordinates) operating at a high clock rate; they are adjustable: by changing circuit parameters one can increase or decrease its inertia, thereby adjusting to external conditions;
- one quartz digital PLL (tracking frequency shifts of the common quartz clock generator), it operates at a high clock rate.

Such an adaptive system allows combining good smoothing of noise fluctuations in individual satellite channels and fast response of the common loop to sharp sudden dynamic effects that cause interrupting or deteriorating of coordinate measurements.

A correction applying to processing signals in the common loop and implementing in the adaptation complex at a high clock rate allows detection and compensation for random errors caused by unpredictable external effects, the correction making the entire system adaptive.

The separate blocks in the adaptation complex are considered in more detail below.

Adaptation Block

Figures 3A, 3B:
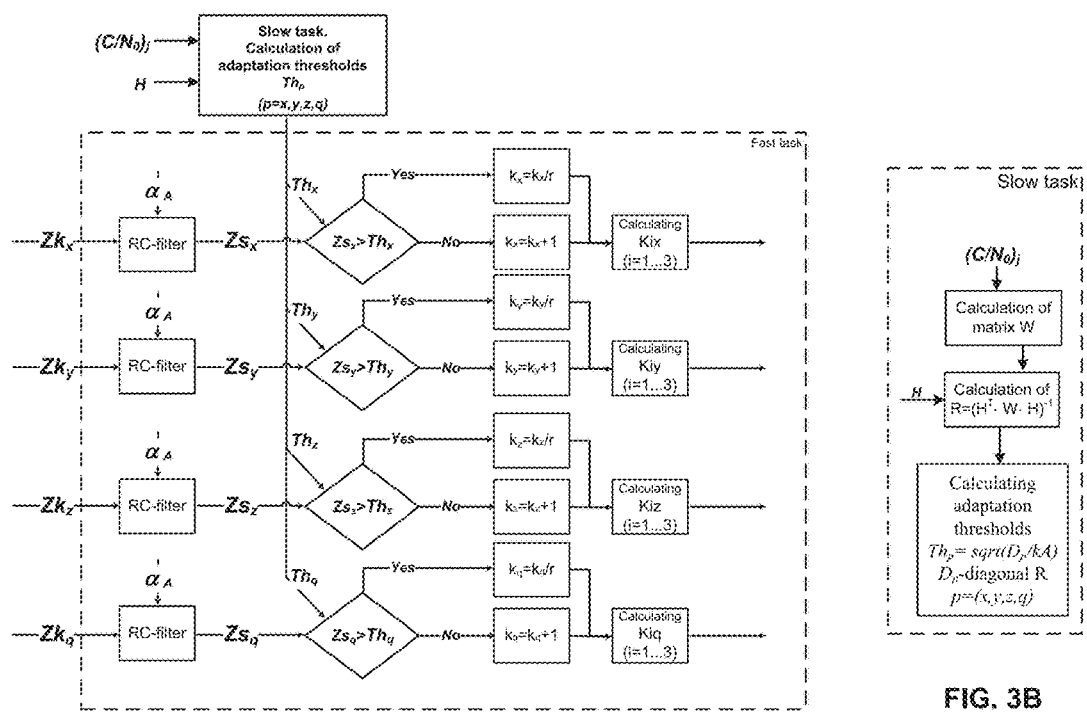
FIG. 3A illustrates the adaptation block of the adaptation complex.
FIG. 3B illustrates the slow task.

A block diagram of the adaptation block is shown in FIG. 3A.

The following operations are performed in this block:
- smoothing coordinate mismatches;
- selecting adaptation thresholds;
- defining scaling coefficients; and
- calculating adaptive coordinate coefficients.

1. Smoothing Coordinate Mismatches

Processing of coordinate mismatch signals arriving at the input of this block starts from smoothing input values with low frequency filters that reduce noise fluctuations.

Smoothing filters are shown in FIG. 3A as "RC-filter" with an externally assigned coefficient $\alpha_A$. As a result, the following smoothed coordinate mismatch signals are obtained: $Zs_x$, $Zs_y$, $Zs_z$, $Zs_q$.

A recursive expression for the smoothing filter is as follows:

$$Zs_p(m) = \alpha_A * Zk_p(m) + (1 - \alpha_A) * Zs_p(m-1)$$

Where $\alpha_A$ is determined by assigning band $B_A$ of the low frequency filter ($B_A$ is typically between 0.1 and 40 Hz):

$$\alpha_A = 1 - \exp(-4 * Tc * B_A)$$

Tc is the clock of the adaptation complex (Tc is typically between 0.001 and 0.005 sec);

m is the number of the clock cycle.

2. Defining Scaling Coefficients

Smoothed coordinate mismatches $Zs_p$ (p=x, y, z, q) are compared with adaptation thresholds $Th_x$, $Th_y$, $Th_z$, $Th_q$, and based on the comparison result (adaptation threshold is exceeded/not exceeded), a decision is taken about a method of calculating scaling coefficients $k_p$ for each of the four coordinates (p=x, y, z, q). In FIG. 3A this comparison operation is shown as conditional transitions with outputs "Yes-No".

If the threshold is exceeded, it shows that a strong interference is present. In this case one needs to quickly reduce the scaling coordinate coefficient $k_p$.

The operation for this case is as follows:

$$k_p(m) = \frac{k_p(m-1)}{r};$$

where r is the integer greater than 1 (it is recommended r=2); and m is the number of the clock cycle.

If, at the next clock cycle, the smoothed coordinate mismatch for coordinate p does not exceed the adaptation threshold, the bandwidth of the common loop should be gradually narrowed (for coordinate p). It can be achieved by performing the following operation with the scaling coordinate coefficient.

$$k_p(m) = k_p(m-1) + 1;$$

Value $k_p$ at any clock is limited by a predetermined range K min and K max which determines maximal and minimal inertia/response rate of the common loop relative to any of p coordinates:

$$K\ min \leq k_p \leq K\ max;$$

Recommended values are: r=2, K min=20, K max=120.

3. Selecting Adaptation Thresholds

The adaptation thresholds $Th_p$ (p=x, y, z, q) being compared with smoothed coordinate mismatches and determining the method sensitivity to dynamic interference intensity on the receiver are calculated by the calculated noise error taken with some reserve. FIG. 3A shows a calculation of adaptation thresholds separated as a single task "Slow task", whose block diagram is shown in FIG. 3B.

Noise errors for coordinates p=x, y, z, q depend first on current values of energy potential for each of N satellites and location of these satellites relative to the receiver, i.e., the available satellite constellation. In addition, smoothing filter parameters a should be taken into account, the filter being used in generation of smoothed coordinate mismatch signals $Zs_p$.

Below is the algorithm of calculating adaptation thresholds $Th_p$ shown in FIG. 3B:

A matrix of noise errors for phase measurements is determined:

$$W = 2*Tc* \begin{vmatrix} (C/N_0)_1 & 0 & 0 & 0 \\ 0 & (C/N_0)_2 & 0 & 0 \\ \ldots & \ldots & \ldots & \ldots \\ 0 & 0 & 0 & (C/N_0)_N \end{vmatrix}$$

where $(C/N_0)_j$ is the energy potential of the signal for the $j^{th}$ satellite measured over an interval Tw. The interval Tw in the slow task can be in a range from 20 ms up to few seconds depending on the receiver operational conditions;

Tc is the operation clock of the adaptation complex.

Diagonal elements of covariance matrix R determine projections of the noise errors for coordinates p=x, y, z, q, where $$R = (H^T * W * H)^{-1},$$

H is the directional cosines matrix supplemented by a unity column-matrix;

Four diagonal elements of matrix R ($R_{00}$, $R_{11}$, $R_{22}$, $R_{33}$) are selected, and four required adaptation thresholds are calculated:

$$Th_x = K \cdot \sqrt{\frac{R_{00}}{k_A}},$$

$$Th_y = K \cdot \sqrt{\frac{R_{11}}{k_A}},$$

$$Th_z = K \cdot \sqrt{\frac{R_{22}}{k_A}},$$

$$Th_q = K \cdot \sqrt{\frac{R_{33}}{k_A}}$$

where $$k_A = \frac{2-\alpha_A}{\alpha_A};$$

and K is a coefficient.

4. Calculating Adaptive Coordinate Coefficients

Adaptive coordinate coefficients $K_{ip}$ (i=1, 2, 3; p=x, y, z, q), as mentioned before, determine the status of loop filters and generate adaptation signals $Za_{ip}$:

$$Za_{ip} = K_{ip} \cdot Zk_p;$$

where (i=1, 2, 3; p=x, y, z, q).

Adaptive coordinate coefficients are calculated after the order of the loop filter has been chosen and scaling coordinate coefficients $k_p$ have been calculated; at the third order for the loop filter (p=x, y, z, q) adaptive coordinate coefficients $K_{ip}$ (i=1, 2, 3; p=x, y, z, q) are calculated for each coordinate according to the following expressions:

$$K_{1p} = \frac{9 \cdot k_p^2 - 9 \cdot k_p + 6}{D};$$

$$K_{2p} = \frac{36 \cdot k_p - 18}{D};$$

$$K_{3p} = \frac{60}{D};$$

where $D = k_p \cdot (k_p^2 + 3 \cdot k_p + 2)$, and p=(x, y, z, q).

When the second order filters are used, adaptive coordinate coefficients are calculated as follows:

$$K_{1p} = \frac{2(2 \cdot k_p - 1)}{k_p \cdot (k_p + 1)};$$

$$K_{2p} = \frac{6}{k_p \cdot (k_p + 1)};$$

$$K_{3p} = 0.$$

And for the first order filters the expressions are:

$$K_{1p} = \frac{1}{k_p + 1};$$

$$K_{2p} = 0;$$

$$K_{3p} = 0.$$

For the third order filters, dynamic properties of the system can be further improved, but noise errors slightly increase. In this case, adaptive coordinate coefficients are calculated as follows:

$$K_{1p} = \frac{9 \cdot k_p^2 + 9 \cdot k_p - 3}{D};$$

$$K_{2p} = \frac{36 \cdot k_p + 42}{D};$$

$$K_{3p} = \frac{60}{D}.$$

Blocks of Common Controlled Loop Filters (CCLFs)

FIG. 4 shows a schematic of the common controlled loop filter (CCLF) for a satellite channel. This schematic is similar to the typical third order filter, but supplemented by control signals from the third order common loop.

In the CCLF of the $j^{th}$ channel, channel mismatch signal Zdj, arriving at the input, is further multiplied by a transfer constant coefficient k1r to generate a control signal of the individual loop $Z\phi j$, which together with the control signal of the common loop $Zc_{\phi j}$ generate a combined control signal of the CCLF $Z_{\psi j}$ sent to the output to control NCO phase.

An acceleration control signal of the common loop $Zc_{vj}$ at the input of the digital acceleration integrator $\Sigma g$, together with the signal obtained as a result of multiplying the channel mismatch signal Zdj by the constant k3r, generates a total signal for the input of a digital acceleration integrator $\Sigma g$.

A velocity control signal of the common loop $Zc_{fj}$ at the input of the digital velocity integrator $\Sigma_f$ is added to the output of the integrator $\Sigma_g$ and the signal Zdj multiplied by a constant k2r;

The output signal of the velocity integrator $\Sigma_f$ is divided by time Tr—the operation clock of the CRS—and used for NCO frequency control.

When one uses the second order CCLF, coefficient k3r is assumed equal to zero, but in the third order common loop, the digital acceleration integrator Σg is used to accumulate acceleration control signals of the common loop $Zc_{vj}$.

The second embodiment of the CCLF is different from the first one in the structure typical for the second order filter.

In this case in CCLF, the input channel mismatch signal Zdj is multiplied by a constant transfer coefficient k1r and generates a control signal of the individual loop Zϕj which together with the control signal of the common loop $Zc_\phi$ generates CCLF control signal $Z_{\psi j}$ further coming to the output to control NCO phase, and control acceleration signal of the common loop $Zc_v$ arrives at the input of the digital acceleration integrator Σg;

Control velocity signal of the common loop $Zc_f$ at the input of the velocity integrator Σf is added to the output of the integrator Σg and signal Zdj, multiplied by constant k2r;

The output signal of the velocity integrator is divided by time Tr (the operation clock of the CRS) and used to control NCO frequency.

The three coefficients (k1r, k2r, k3r) are defined as:

$$k1r = \frac{8}{3} \cdot B^{PLL} \cdot Tr$$
$$k2r = 0.5 \cdot (k1r)^2$$
$$k3r = 0.0667 \cdot (k1r)^3$$

Exemplary Tr is typically between 0.001 and 0.02 sec, and $B^{PLL}$ is typically between 1 and 40 Hz.

If the adaptation complex operates at the frequency of the individual loops, coordinate mismatch signals $Z_{kp}$ projected onto the direction of the range vector of each satellite can be subtracted from the signals Zdj before they are fed to the inputs of the CCLF. Such subtraction allows a removal of loading individual loops from common influences.

Having thus described a preferred embodiment, it should be apparent to those skilled in the art that certain advantages of the described method and apparatus have been achieved. It should also be appreciated that various modifications, adaptations and alternative embodiments thereof may be made within the scope and spirit of the present invention. The invention is further defined by the following claims.

What is claimed is:

1. A system for estimating carrier phases of radio signals in a satellite navigation system receiver for coordinate determination, the system comprising:
a complex of reference signals (CRS), wherein, in each $j^{th}$ satellite channel, a digital reference signal $RefSig_j$, represents an output phase and frequency-controlled oscillation of a corresponding numerically-controlled oscillator ($NCO_j$) for each $j^{th}$ satellite channel, the phase of the oscillation of the $NCO_j$ tracking a carrier signal received from the $j^{th}$ satellite; and
an adaptation complex (AC) that, using errors in tracking of a phase of the carrier signal received from the $j^{th}$ satellite, generates coordinate changes and receiver clock changes for each epoch, and uses an adaptive filter to detect the coordinate changes and the receiver clock changes that are due to receiver movement, and, based on the analysis, generates control signals for each $j^{th}$ satellite channel, wherein the control signals change an effective bandwidth of a common controlled loop filter (CCLFj) for each $j^{th}$ satellite channel so as to reduce dynamic errors of phase estimates, and to thereby reduce dynamic distortions in coordinate measurements,
wherein the CRS and the AC are coupled through the common controlled loop filter ($CCLF_j$) for each $j^{th}$ satellite channel.

2. The system of claim 1, wherein:
each of the j satellite channels has a phase locked loop ($PLL_j$);
a radio signal received from the $j^{th}$ satellite is fed to an input of a corresponding $PLL_j$;
each $PLL_j$ includes the $NCO_j$, an individual loop filter that is part of the $CCLF_j$, a correlator and a discriminator;
the correlator generates correlation signals ($I_j$, $Q_j$) based on a reference signal from the $NCO_j$ at a clock rate Fc;
accumulation is produced in the correlator, the clock rate Fc is reduced, and correlation signals ($I_{sj}$, $Q_{sj}$) of individual $PLL_j$ are outputted;
a channel mismatch signal $Zd_j$ in each discriminator is generated based on the correlation signals ($I_{sj}$, $Q_{sj}$) for each $PLL_j$, which is fed to an input of the $CCLF_j$;
wherein $Zd_j$=Arctg($Q_j/I_j$) or $Zd_j$=$Q_j/I_j$;
wherein the $CCLF_j$ is controlled using the signal $Zd_j$ and control signals $Zc_{pj}$ (p=v, f, ϕ; j=1 . . . N) from the AC;
wherein the control signals for the $NCO_j$ include a signal $Z_{fj}$ that controls the frequency of the $NCO_j$ and a signal $Z_{\psi j}$ that controls the phase of the $NCO_j$; and
wherein the correlator receives the signal $RefSig_j$ from the $NCO_j$, and uses the signals $RefSig_j$ to form the correlation signals ($I_j$, $Q_j$) that are inputted to the AC.

3. The system of claim 2, wherein the signal fed to the $PLL_j$ is first amplified, filtered and digitized.

4. The system of claim 2, wherein:
in the AC, the correlation signals ($I_j$, $Q_j$), after passing through the discriminators, form channel mismatch signals $Zdc_j$ which are then transformed using a least squares method into common loop coordinate mismatch signals $Zk_p$ (p=x, y, z, q), of which three signals ($Zk_x$, $Zk_y$, $Zk_z$) correspond to geometric location of the receiver and the signal $Zk_q$ corresponds to local displacement due to a local clock signal generator;
an adaptation block included in the AC that uses the mismatch signals $Zk_p$ and provides, for each coordinate p for a third order coordinate loop filter, defined by adaptive coordinate coefficients $K_{ip}$ (p=x, y, z, q; i=1, 2, 3), which are then used to multiply the signal $Zk_p$ to produce three coordinate adaptation signals $Za_{ip}$ (p=x, y, z, q, i=1, 2, 3) for each coordinate p;
the signals $Za_{ip}$ are projected onto a direction vector for each satellite j, and, together with the clock signal $Za_{iq}$ (i=1, 2, 3) form common loop control signals $Zc_{pj}$ (p=v, f, ϕ; j=1 . . . N);
the signals $Zc_{pj}$ are received by the $CCLF_j$ and are used to control the $NCO_j$ for the j satellites; and
the $NCO_j$ produces corrected digital values of the carrier phases, which are used to determine coordinates of the receiver.

5. The system of claim 4, wherein the adaptation block smoothes the signals $Zk_p$ with a low pass filter according to:

$Zs_p(m)=\alpha_A*Zk_p(m)+(1-\alpha_A)*Zs_p(m-1)$ to produce a mismatch signal $Zs_p$ (p=x, y, z, q),
where $\alpha_A$=1exp(−4*Tc*$B_A$),
Tc is a period of a clock cycle of the adaptation block,
$B_A$ is a bandwidth of the low pass filter, and
m is a number of the clock cycle; and
the signals $Zs_p$ are compared with adaptation thresholds $Th_p$ (p=x, y, z, q), and scale coefficients $k_p$ (p=x, y, z, q) are calculated based on the $K_{ip}$.

6. The system of claim 5, wherein the $K_{ip}$ are calculated by:
a) determining $Th_p$ for each mismatch signal $Zs_p$;
b) for each measured coordinate, determining $k_p$ that depend on comparison with $Th_p$;
c) given the order of the coordinate loop filter and based on the calculated $k_p$, calculating $K_{ip}$ for the common loops.

7. The system of claim 6, wherein the step of determining of the $Th_p$ is based on a matrix W that contains an energy potential of signals from the j satellites, measured in a time interval Tw:

$$W = 2*Tc* \begin{vmatrix} (C/N_0)_1 & 0 & 0 & 0 \\ 0 & (C/N_0)_2 & 0 & 0 \\ \cdots & \cdots & \cdots & \cdots \\ 0 & 0 & 0 & (C/N_0)_N \end{vmatrix};$$

where $(C/No)_j$ is an energy potential of the signal from the $j^{th}$ satellite;
a covariance matrix R is calculated as $R=(H^T*W*H)^{-1}$, where H-matrix of directional cosines, supplemented by a unit column-vector; and
four diagonal elements $(R_{00}, R_{11}, R_{22}, R_{33})$ are taken from the matrix R to calculate the four thresholds:

$$Th_x = K \cdot \sqrt{\frac{R_{00}}{k_A}},$$

$$Th_y = K \cdot \sqrt{\frac{R_{11}}{k_A}},$$

$$Th_z = K \cdot \sqrt{\frac{R_{22}}{k_A}},$$

$$Th_q = K \cdot \sqrt{\frac{R_{33}}{k_A}},$$

where $$k_A = \frac{2-\alpha_A}{\alpha_A};$$

and
K is a constant.

8. The system of claim 7, wherein the constant K is between 3 and 4.

9. The system of claim 6, wherein:
for the step of determining $k_p$, for each clock cycle and for each measured coordinate, calculating smoothed signals $Zs_p$ (p=x, y, z, q) with their corresponding $Th_p$; and using the signals $Zs_p$ with their corresponding $Th_p$, calculating the scale coordinate coefficients $k_p$ (p=x, y, z, q) based on:
if $Zs_p > Th_p$, then $k_p$ is reduced by a factor of r with each clock cycle, where r is a constant greater than 1; otherwise $k_p$ is increased by 1; and $K\min \leq k_p \leq K\max;$ where Kmin and Kmax are constants.

10. The system of claim 6, wherein, in the step of calculating $K_{ip}$, for the common loop having a third order, for each measured coordinate (p=x, y, z, q), $K_{ip}$ are calculated as follows:

$$K_{1p} = \frac{9 \cdot k_p^2 - 9 \cdot k_p + 6}{D};$$

$$K_{2p} = \frac{36 \cdot k_p - 18}{D}; \text{ and}$$

$$K_{3p} = \frac{60}{D},$$

where $D=k_p \cdot (k_p^2 + 3 \cdot k_p + 2)$.

11. The system of claim 6, wherein, in the step of calculating $K_{ip}$, for the common loop having a third order, for each measured coordinate (p=x, y, z, q), $K_{ip}$ are calculated as follows:

$$K_{1p} = \frac{9 \cdot k_p^2 + 9 \cdot k_p - 3}{D};$$

$$K_{2p} = \frac{36 \cdot k_p + 42}{D};$$

$$K_{3p} = \frac{60}{D};$$

where $D=k_p \cdot (k_p^2 + 3 \cdot k_p + 2)$.

12. The system of claim 6, wherein, in the step of calculating $K_{ip}$, for the common loop having a second order, for each measured coordinate (p=x, y, z, q), $K_{ip}$ are calculated as follows:

$$K_{1p} = \frac{2(2 \cdot k_p - 1)}{k_p \cdot (k_p + 1)};$$

$$K_{2p} = \frac{6}{k_p \cdot (k_p + 1)};$$

$$K_{3p} = 0.$$

13. The system of claim 6, wherein, in the step of calculating $K_{ip}$, for the common loop having a first order, for each measured coordinate (p=x, y, z, q), $K_{ip}$ are calculated as follows:

$$K_{1p} = \frac{1}{k_p + 1};$$

$$K_{2p} = 0;$$

$$K_{3p} = 0.$$

14. The system of claim 4, wherein:
the control signals for the common loop $Zc_{pj}$ (p=v, f, φ; j=1 ... N) are used so that each $CCLF_j$ in the $j^{th}$ channel receives three components as follows:
a common loop control signal $Zc_{vj}$ that controls $NCO_j$ frequency changes, corrects a receiver acceleration measurement in a direction of the $j^{th}$ satellite;
a common loop control signal $Zc_{fj}$ that controls $NCO_j$ frequency, corrects a receiver velocity change in a direction of the $j^{th}$ satellite; and
a common loop control signal $Zc_{φj}$ that controls $NCO_j$ phase, corrects a phase shift common for all satellites caused by a local clock generator.

15. The system of claim 14, wherein:
each $CCLF_j$ include a digital velocity integrator $\Sigma_f$ and a digital acceleration integrator $\Sigma_g$;

the digital velocity integrator $\Sigma_f$ integrates Zdj*k2r, the signal $Zc_{fj}$ and the integrated value from $\Sigma_g$; and the digital acceleration integrator $\Sigma_g$ integrates the signal Zdj*k3r and the signal $Zc_{vj}$.

16. The system of claim 2, wherein an order $p_{ind}$ of each $PLL_j$ is defined by three coefficients (k1r, k2r, k3r), and if $p_{ind}$=2, then k1r>0, k2r>0, and k3r=0, if $p_{ind}$=3, then k1r>0, k2r>0 and k3r>0.

17. The system of claim 4, wherein an order $p_{com}$ of the coordinate loop filter is defined by the three adaptive coordinate coefficients $K_{ip}$ (p=x, y, z, q), and if $p_{com}$=3, then $K_{ip}$>0 for i=1, 2, 3;

if $p_{com}$=2, then $K_{ip}$>0 for i=1, 2; $K_{3p}$=0;

if $p_{com}$=3, then $K_{1p}$>0; $K_{2p}$=0, $K_{3p}$=0.

18. A device for estimating carrier phases of radio signals in a satellite navigation system receiver for coordinate measurement, the device comprising:

a module of reference signals (MRS), wherein, in each $j^{th}$ satellite channel, a digital reference signal $RefSig_j$, represents an output phase and frequency-controlled oscillation of a corresponding numerically-controlled oscillator ($NCO_j$), the output phase tracking a carrier signal received from the $j^{th}$ satellite; and an adaptation module (AM) that, using errors in tracking of a phase of the carrier signal received from the $j^{th}$ satellite, generates coordinate changes and receiver clock changes for each epoch, and uses an adaptive filter to detect the coordinate changes and the receiver clock changes that are due to receiver movement, and, based on the analysis, generates control signals for each $j^{th}$ satellite channel, wherein the control signals change an effective bandwidth of a common controlled loop filter (CCLFj) for each $j^{th}$ satellite channel so as to reduce dynamic errors of phase estimates, and to thereby reduce dynamic distortions in coordinate measurements, wherein each $j^{th}$ satellite channel includes the common controlled loop filter ($CCLF_j$) through which the MRS and the AM are coupled.

19. The device of claim 18, wherein:

each $j^{th}$ satellite channel has a phase locked loop ($PLL_j$) receiving a radio signal received from the $j^{th}$ satellite;

each $PLL_j$ includes the $NCO_j$, an individual loop filter that is part of the $CCLF_j$, a correlator and a discriminator;

the correlator of each $PLL_j$ outputs correlation signals ($I_j$, $Q_j$) based on a reference signal from the $NCO_j$;

the discriminator generates a channel mismatch signal $Zd_j$ based on the correlation signals, which is fed to an input of the $CCLF_3$;

wherein $Zd_j$=Arctg($Q_j/I_j$) or $Zd_j$=$Q_j/I_j$;

wherein the $CCLF_j$ is controlled using the signal $Zd_j$;

wherein the $CCLF_j$ outputs a signal $Z_{fj}$ that controls the frequency of the $NCO_j$ and a signal $Z_{\psi j}$ that controls the phase of the $NCO_j$; and wherein the correlator uses the signal $RefSig_j$ to form the correlation signals ($I_j$, $Q_j$) that are inputted to the AM.

20. The device of claim 19, wherein:

in the AM, the correlation signals ($I_j$, $Q_j$) are transformed into common loop coordinate mismatch signals $Zk_p$ (p=x, y, z, q), of which the signals $Zk_x$, $Zk_y$, $Zk_z$ correspond to geometric location of the receiver and the signal $Zk_q$ corresponds to local displacement due to a local clock signal generator;

an adaptation block of the AM provides, for each coordinate p for a coordinate loop filter, defined by the adaptive coordinate coefficients $K_{ip}$ (p=x, y, z, q; i=1, 2, 3), multiplies the signal $Zk_p$ to produce three coordinate adaptation signals $Za_{ip}$ (p=x, y, z, q, i=1, 2, 3) for each coordinate p;

the signals $Za_{ip}$ are used to form common loop control signals $Zc_{pj}$ (p=v, f, $\phi$; j=1 . . . N);

the signals $Zc_{pj}$ are received by the $CCLF_j$ and are used to control the $NCO_j$; and the $NCO_j$ produces corrected digital values of the carrier phases, which are used to the coordinate measurement.

21. The device of claim 20, wherein the adaptation block smoothes the signals $Zk_p$ with a low pass filter according to $Zs_p(m)=\alpha_A*Zk_p(m)+(1-\alpha_A)*Zs_p(m-1)$ to produce a mismatch signal $Zs_p$ (p=x, y, z, q), where $\alpha_A=1-\exp(-4*Tc*B_A)$, Tc is a period of a clock cycle of the adaptation block, $B_A$ is a bandwidth of the low pass filter, and m is a number of the clock cycle; and the signals $Zs_p$ are compared with adaptation thresholds $Th_p$ (p=x, y, z, q), and scale coefficients $k_p$ (p=x, y, z, q) are calculated based on the $K_{ip}$.

22. The device of claim 21, wherein the $K_{ip}$ are calculated by:

a) determining $Th_p$ for each mismatch signal $Zs_p$;

b) for each measured coordinate, determining $k_p$ that depend on comparison with $Th_p$;

c) given the order of the coordinate loop filter and based on the calculated $k_p$, calculating $K_{ip}$ for the common loops.

23. The device of claim 22, wherein:

the control signals for the common loop $Zc_{pj}$ (p=v, f, $\phi$; j=1 . . . N) are used so that each $CCLF_j$ in the $j^{th}$ channel receives three components as follows:

a common loop control signal $Zc_{vj}$ that controls $NCO_j$ frequency changes, corrects a receiver acceleration measurement in a direction of the $j^{th}$ satellite;

a common loop control signal $Zc_{fj}$ that controls $NCO_j$ frequency, corrects a receiver velocity change in a direction of the $j^{th}$ satellite; and a common loop control signal $Zc_{\phi j}$ that controls $NCO_j$ phase, corrects a phase shift caused by a local clock generator.

24. The device of claim 23, wherein an order $p_{ind}$ of each $PLL_j$ is defined by three coefficients (k1r, k2r, k3r), and if $p_{ind}$=2, then k1r>0, k2r>0, and k3r=0, if $p_{ind}$=3, then k1r>0, k2r>0 and k3r>0.

25. The device of claim 24, wherein an order $p_{com}$ of the coordinate loop filter is defined by the three adaptive coordinate coefficients $K_{ip}$ (p=x, y, z, q), and if $p_{com}$=3, then $K_{ip}$>0 for i=1, 2, 3;

if $p_{com}$=2, then $K_{ip}$>0 for i=1, 2; $K_{3p}$=0;

if $p_{com}$=3, then $K_{1p}$>0; $K_{2p}$=0, $K_{3p}$=0.

* * * * *